(12) United States Patent
Ishimine et al.

(10) Patent No.: US 6,608,751 B2
(45) Date of Patent: Aug. 19, 2003

(54) ELECTRONIC DEVICE

(75) Inventors: Junichi Ishimine, Kawasaki (JP); Masahiro Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 3 days.

(21) Appl. No.: 09/840,149

(22) Filed: Apr. 24, 2001

(65) Prior Publication Data

US 2002/0085356 A1 Jul. 4, 2002

(30) Foreign Application Priority Data

Dec. 26, 2000 (JP) ........................................ 2000-395978

(51) Int. Cl.$^7$ ................................................. H05K 7/20
(52) U.S. Cl. ........................ 361/687; 361/692; 361/695; 165/104.21
(58) Field of Search ................................ 361/699, 700, 361/704, 683, 707–717, 727, 736, 752; 165/80.3, 80.4, 104.21–104.26, 104.33, 104.34, 185; 257/714, 715; 454/184

(56) References Cited

U.S. PATENT DOCUMENTS 5,076,351 A * 12/1991 Munekawa et al. .... 165/104.21
5,203,399 A * 4/1993 Koizumi ................ 165/104.33
5,646,824 A 7/1997 Ohashi et al.
6,227,287 B1 * 5/2001 Tanaka et al. ............. 165/80.4
6,442,025 B2 * 8/2002 Nakamura et al. .......... 361/695

FOREIGN PATENT DOCUMENTS

| EP | 1081759 A2 | * | 3/2001 | ......... H01L/23/427 |
| JP | 401019754 A | * | 1/1989 | ........... H01L/23/46 |
| JP | 06-266474 | | 9/1994 | |
| JP | 410065077 A | * | 3/1998 | ......... H01L/23/427 |
| JP | 410173115 A | * | 6/1998 | ......... H01L/23/427 |

* cited by examiner

Primary Examiner—Michael Datskovsky
(74) Attorney, Agent, or Firm—Staas & Halsey LLP

(57) ABSTRACT

In an electronic device that contains a cooling system in which the refrigerant circulates through both the base and the heat-radiator and the heat-radiator is installed away from and to the side of the heat-generator, the heat-generator is positioned on top of the base. This means that the height of the base in the electronic device becomes relatively low, and so the height of the heat-radiator—which must be installed above the height of the base—can be increased, meaning that the required heat-radiating region can be secured and high-performance cooling becomes possible.

4 Claims, 5 Drawing Sheets

ELECTRONIC DEVICE

BACKGROUND OF THE INVENTION

1. Field of the Invention

The present invention relates to an electronic device having a cooling system that cools a heat-generator such as electronic components like a CPU, and more particularly to an electronic device having a cooling system with improved cooling performance.

2. Description of the Related Art

Rapid headway is being made in making electronic devices—in particular computers that contain CPUs—smaller in size and higher in performance. The electronic components such as CPUs built into such electronic devices generate heat during operation. If this heat is not radiated then the performance of the electronic components will drop and there will be a risk of them failing. A cooling system for the electronic components is thus necessary. As electronic devices have become smaller and thinner in recent years, the amount of space available in which to put a cooling system has decreased, meaning that high-performance cooling systems have become required.

FIGS. 10A, 10B and 10C illustrate conventional cooling systems used in electronic devices. FIGS. 10A, B and C show cross-sectional views of an electronic device, with a processor module—on which is mounted a CPU (processor) and the like—and a memory which are built into the electronic device being shown as an example of a heat-generator.

First let us describe the positioning of the processor module 18 in the electronic device casing 10. In FIGS. 10A, 10B and 10C, a motherboard 12 is positioned on the bottom face of the electronic device, and a processor module board 16 is mounted on the motherboard 12 via a socket 14. A processor module 18 is mounted on the processor module board 16. A secondary cache memory 20 is also mounted on the processor module board 16. A thermally connecting material 22 is mounted on the secondary cache memory 20 in order to level the same with the processor module 18.

An example of a familiar cooling system for cooling a heat-generator such as the processor module 18 is a heat sink such as that shown in FIG. 10A. The heat sink has a base 24 and a heat-radiator 26. The base 24 has a face in contact with the heat-generator such as the processor module 18 and the memory, while the heat-radiator 26 comprises fins or the for expanding surface area so that heat can be radiated into the air efficiently. The base 24 and the heat-radiator 26 are, for example, formed integrally from a metal having a high thermal conductivity such as copper or aluminum.

As shown in FIG. 10A, the motherboard 12 is generally placed in the electronic device casing 10 in such a way that the face on which the processor module 18 is mounted is the upper face. This is because the processor module 18 is an electronic component that may need to be removed for maintenance or replacement, and is to facilitate such maintenance or replacement work. If the motherboard 12 is positioned in such a way that the face on which the processor module 18 is mounted faces downwards then the motherboard 12 itself would have to be removed from the electronic device in order to remove the processor module 18, making maintenance work less efficient.

When the processor module 18 is positioned in this way, the base 24 of the heat sink is in close contact with the upper face of the processor module 18—which is a heat-generator—and thus absorbs heat from the processor module 18. If there is a space above the base 24 as shown in FIG. 10A, then the heat-radiator 26 is positioned in this space. The heat transported to the heat-radiator 26 is efficiently radiated by the current of air from a fan 28.

However, if for example as shown in FIG. 10B another electronic component 32 built into the electronic device such as a power supply unit or a channel card is positioned above the heat-generator, meaning that there is insufficient space above the processor module 18 in which to put the heat-radiator 26, then the base 24 is lengthened and the heat-radiator 26 is installed to the side of the processor module 18. In this case, in order to secure the volume required for the heat-radiator 26, the heat-radiator 26 can be in two portions, with one portion installed on the top of the base 24 and the other portion installed on the bottom of the base 24. This is because since the base 24 is positioned above the processor module 18, in the region to the side of the heat-generator there is a space below the extended part of the base 24 that goes from the motherboard 12 up to the height of the processor module 18.

FIG. 10B shows an example of securing the volume required for the heat-radiator 26. It shows that in the case that heat is transmitted through the heat sink by conduction, it is effective to install a portion of the heat-radiator 26 on the bottom of the base 24.

If the heat-radiator 26 of the cooling system is installed away from the heat-generator, then it is necessary to transport the heat absorbed by the base 24 to the heat-radiator 26 as efficiently as possible. Consequently, the base 24 may be a plate shaped heat pipe filled with a prescribed refrigerant that is more efficient at conducting heat than metal, or may have pipe-shaped heat pipes embedded in its metallic interior. Hollow parts for storing the refrigerant are provided inside the heat pipes, and heat is transported by the refrigerant vaporizing due to the heat and then migrating into the heat-radiator 26.

Moreover, in one known type of cooling system that uses a refrigerant, vaporized refrigerant circulates not only through the base 24 but also through the heat-radiator 26 (see for example Japanese Patent Application Laid-open No. 10-335552). With this type of cooling system, hollow parts for storing the refrigerant are provided in the base 24, and the heat-radiator 26 has a mechanism in which vaporized refrigerant flowing in from the base 24 is made to circulate and condenses.

In such a cooling system for which the refrigerant circulates through both the base 24 and the heat-radiator 26, the heat-radiator 26 must be installed on top of the base 24. Moreover, the region of the base 24 around where the heat-generator are installed must fundamentally speaking be immersed in the liquid refrigerant, or else there is a marked drop in performance. If the heat-radiator 26 is installed below the base 24, then the portion below the base 24 (on which the heat-generator are installed) becomes full of condensed liquid refrigerant, meaning that liquid refrigerant accumulates in the heat-radiator 26. In this case, vaporized refrigerant does not circulate through the heat-radiator 26 (which is full of liquid refrigerant) meaning that there is virtually no contribution to cooling.

With a cooling system in which the refrigerant flows into the heat-radiator 26, when the heat-radiator 26 is installed away from and to the side of the heat-generator, the heat-radiator 26 can thus only be installed on top of the base 24 as shown in FIG. 10C. However, with electronic devices being made smaller and thinner, there is a problem that there may not be sufficient height above the base 24, making it impossible to secure the volume required for the heat-radiator 26.

SUMMARY OF THE INVENTION

With the foregoing in view, it is an object of the present invention to provide an electronic device that contains a cooling system in which the refrigerant circulates through both the base and the heat-radiator, and the heat-radiator is installed away from and to the side of the heat-generator, and wherein it is possible to secure the volume (region) required for the heat-radiator.

In order to achieve the above-mentioned object, with the present invention, in an electronic device that contains a cooling system in which the refrigerant circulates through both the base and the heat-radiator and the heat-radiator is installed away from and to the side of the heat-generator, the heat-generator are positioned on top of the base. This means that the height of the base in the electronic device becomes relatively low, and so the height of the heat-radiator—which must be installed above the height of the base—can be increased, meaning that the required heat-radiating region can be secured and high-performance cooling becomes possible.

An example of a configuration of the electronic device of the present invention for achieving the above-mentioned object is as follows:

An electronic device comprises
  a heat-generator, and
  a cooling unit including
    a base having a first face that is thermally connected to the heat-generator and having a hollow part filled with a refrigerant inside, and
    a heat-radiator that is thermally connected to the base and that has a space part that is linked to the hollow part,
    wherein the heat-radiator is positioned above the base in the direction of gravity, and the refrigerant that vaporizes in the hollow part circulates through the heat-radiator and condenses to become a liquid,
  wherein the heat-generator is positioned above the base in the direction of gravity.

In the above configuration, the heat-radiator is, for example, thermally connected to part of the first face of the base. Moreover, the base may have a projecting portion on the hollow part side of the first face in the region in which the base is thermally connected to the heat-generator, with this projecting portion extending into the hollow parts and being immersed in the refrigerant.

DESCRIPTION OF THE PREFERRED EMBODIMENTS

Following is a description of embodiments of the present invention. Note, however, that the technical scope of the present invention is not limited to these embodiments. In these embodiments, the up/down direction is the direction of gravity.

Figure 1:
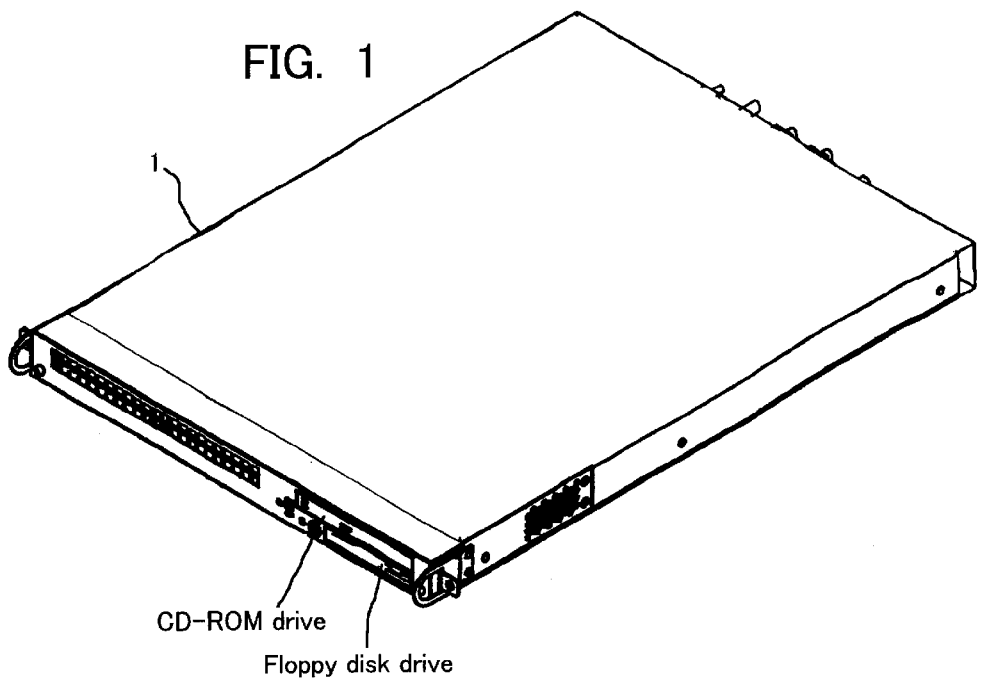
FIG. 1 shows a perspective view of the outside of the electronic device in an embodiment of the present invention.

FIG. 1 shows a perspective view of the outside of the electronic device in an embodiment of the present invention. In this example, the electronic device is a server. In the thin casing of the server 1 are housed various electronic components such as a power source, a motherboard on which are mounted a heat-generator such as a CPU (processor module), a main memory, a channel card, a hard disk drive, a floppy disk drive and a CD-ROM drive, with these electronic components not being shown in the diagram. Note that the insertion openings of the floppy disk drive and the CD-ROM drive are shown in FIG. 1.

Figure 2:
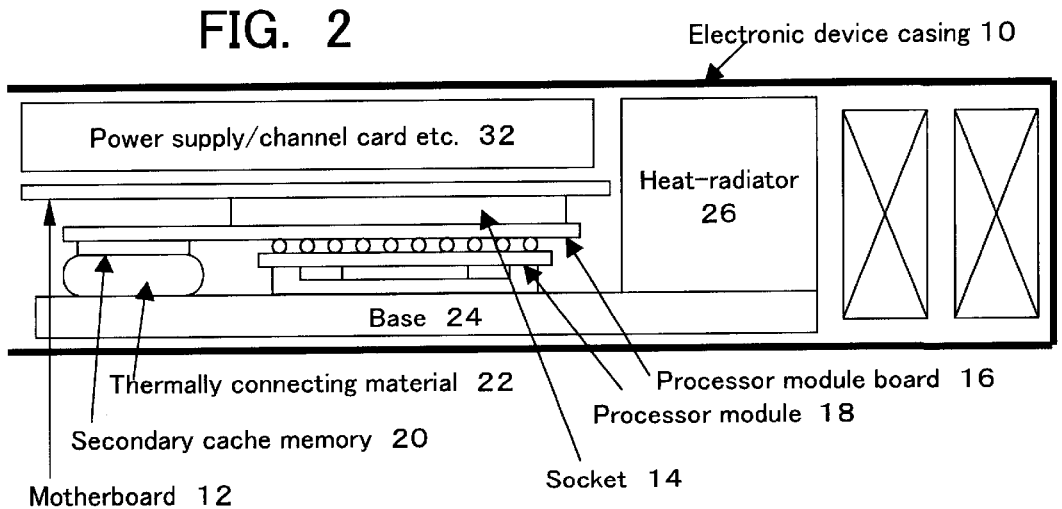
FIG. 2 shows an example of a cross-sectional view of the electronic device in an embodiment of the present invention.
Figure 10A:
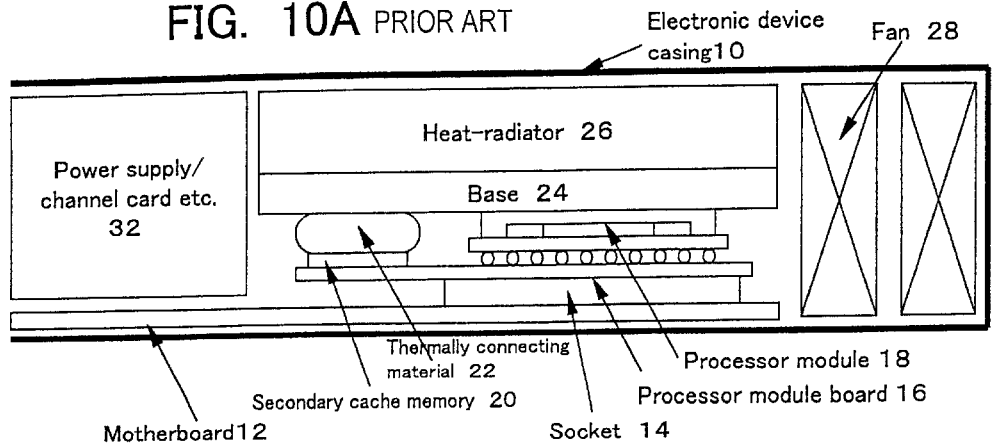
FIGS. 10A, 10B, and 10C illustrate conventional cooling systems in electronic devices.
Figure 10B:
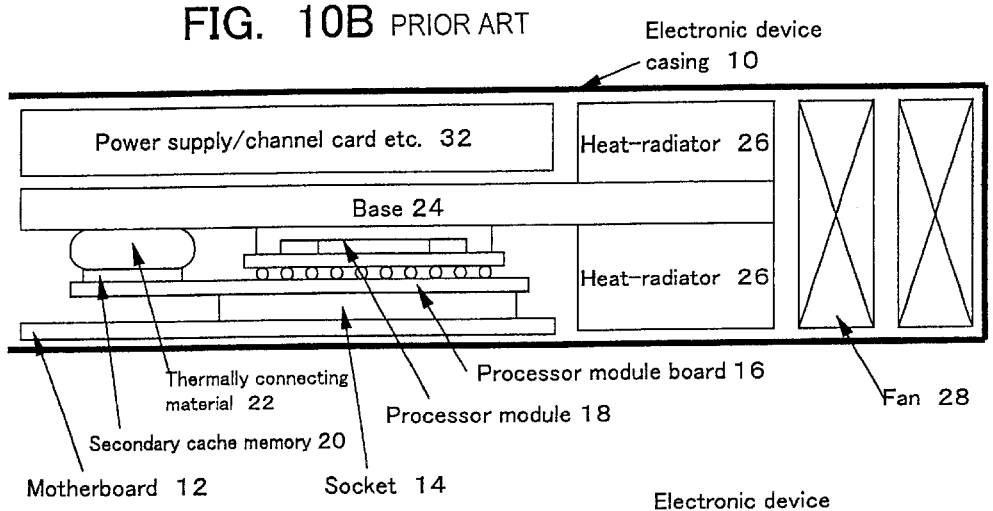
Figure 10C:
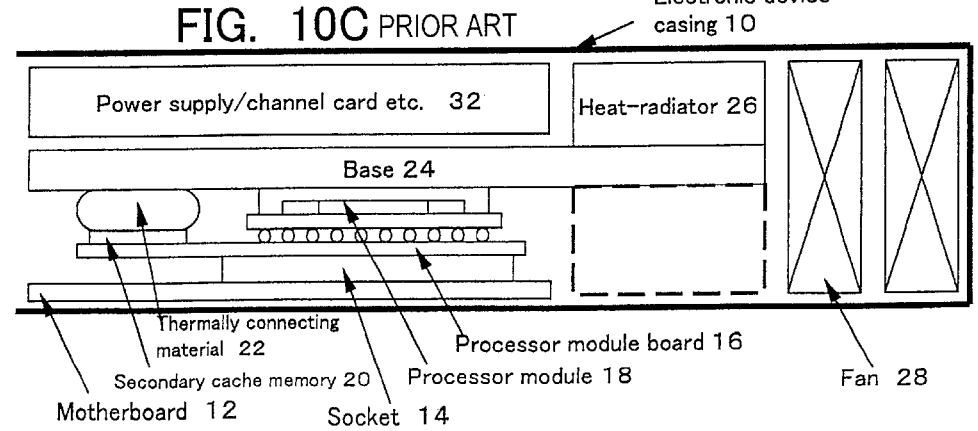

FIG. 2 shows an example of a cross-sectional view of the electronic device in an embodiment of the present invention. Following is a description of the layout of the cooling system in the electronic device of the present invention, with reference to FIG. 2. Note that the elements in the drawings from FIG. 2 onwards described below are given the same reference numbers as the same elements in FIG. 10. The cooling system has a base 24 that is in contact with a heat-generator such as a processor module 18 that are mounted on a motherboard 12, and a heat-radiator 26 that is connected to the base 24 to the side of the processor module 18.

In the embodiments of the present invention, the heat-generator is mounted on top of the base 24 of the cooling system. Specifically, the base 24 is positioned on the bottom face in the casing of the electronic device, and the motherboard 12 on which are mounted things like the processor module 18 is positioned on top of the base 24 facing downwards. In the case that the motherboard 12 is positioned facing upwards, the socket 14 is installed on top of it, the processor module board 16 is mounted on top of the socket 14, and the processor module 18 is mounted on top of this. Moreover, a secondary cache memory 20 is also mounted on the processor module board 16, and a thermally connecting material 22 is mounted on the secondary cache memory 20 in order to level with the processor module 18. Consequently, by positioning the motherboard 12—on which is mounted the processor module 18—facing downwards, the base 24 is thermally connected to the processor module 18, which is a heat-generator, and to the memory via the thermally connecting material 22.

The heat-radiator 26 is positioned to the side of the processor module 18, thermally connected to the base 24. As with conventional art, the heat-radiator 26 must be positioned above the height of the base 24. By positioning the heat-generator on top of the base 24, the base 24 can be positioned in a position lower than the height of the processor module 18 that is found when the motherboard 12 is positioned facing upwards. This means that the height of the heat-radiator 26 installed on top of the base 24 can be increased, meaning that the volume required for the heat-radiator 26 can be secured.

Figure 3:
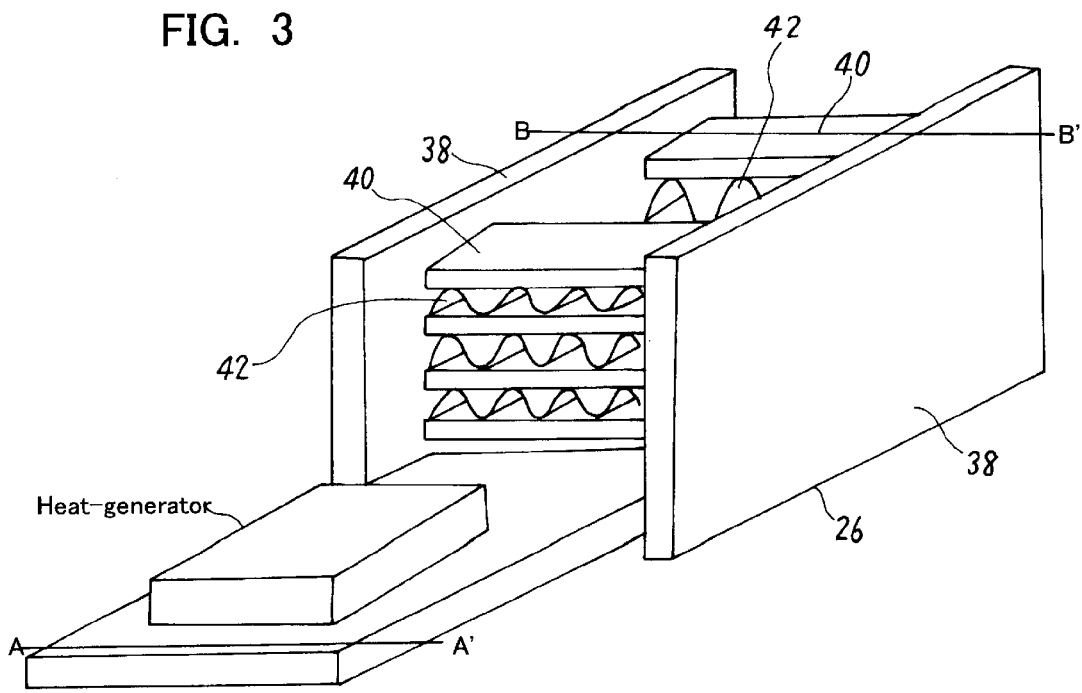
FIG. 3 shows a perspective view of the cooling system.

FIG. 3 shows a perspective view of the cooling system. The base 24 of the cooling system is thermally connected to the heat-generator. The base 24 is, for example, formed in a plate shape from a metallic thermally conducting material such as copper or aluminum, and has inside it hollow parts filled with a refrigerant.

Figure 4:
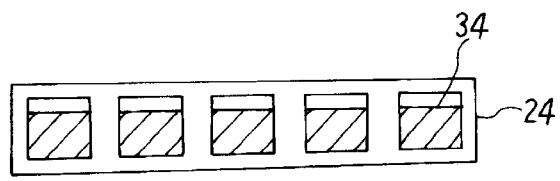
FIG. 4 shows a cross-sectional view of the base along the line A—A shown in FIG. 3.

FIG. 4 shows a cross-sectional view of the base 24 along the line A–A' shown in FIG. 3. As shown in FIG. 4, a plurality of hollow parts 34 are provided inside the base 24, with each being filled with the refrigerant.

Figure 5:
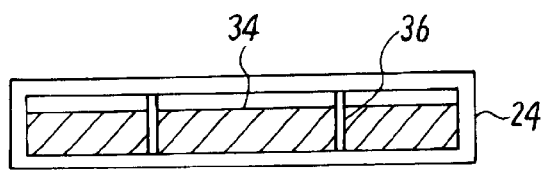
FIG. 5 shows another cross-sectional view of the base.

FIG. 5 shows another cross-sectional view of the base 24. The hollow parts 34 may, for example, be formed in a single flat shape, in which case ribs 36 or the like may be provided inside the hollow parts 34 in order to make the base 24 sufficiently strong.

Returning to FIG. 3, refrigerant that has vaporized in the base 24 is made to circulate through the heat-radiator 26 of the cooling system whereupon it condenses. The heat-radiator 26 has two headers 38, with a plurality of heat-radiating tubes 40 and heat-radiating fins 42 passing between them.

Figure 6:
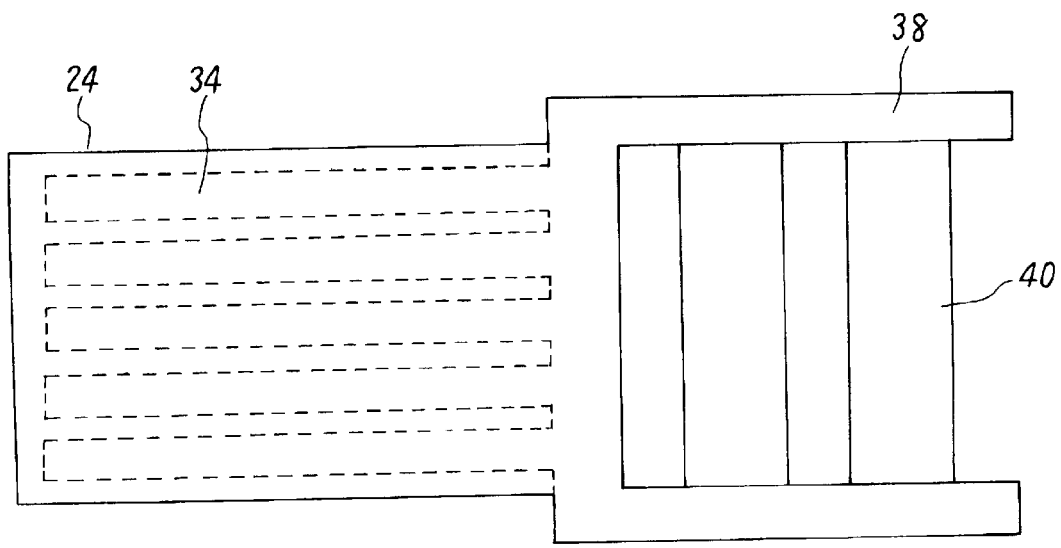
FIG. 6 shows a top view of the cooling system.

FIG. 6 shows a top view of the cooling system. As shown in FIG. 6, the two headers are each linked to the hollow parts 34 of the base 24, meaning that refrigerant that has vaporized in the base 24 flows into the headers. That is, the heat-radiator 26 is thermally connected to the base 24 via the headers 38. Since the hollow parts 34 of the base 24 are linked to the headers 38, liquid refrigerant fills into the headers 38 up to the same height as the liquid level in the hollow parts 34 of the base 24. As described earlier, the heat-radiator 26 must be installed above the height of the base 24. This is because if the heat-radiator 26 is installed below the height of the base 24, then liquid refrigerant would accumulate in the portion below the base, meaning that vaporized refrigerant would not be able to circulate and there would be no contribution to cooling.

Refrigerant in the base 24 is vaporized by the heat from the heat-generator in contact with the base 24. The vaporized refrigerant expands in volume in the space above the liquid level in the hollow parts 34 and thus migrates.

Figure 7:
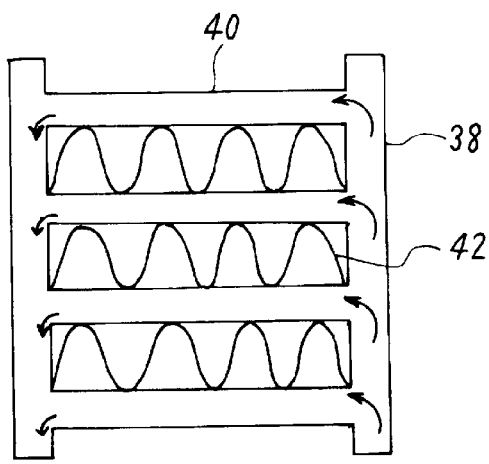
FIG. 7 shows a cross-sectional view of the heat-radiator along the line B–B' shown in FIG. 3.

FIG. 7 shows a cross-sectional view of the heat-radiator 26 along the line B–B' shown in FIG. 3. In FIG. 7, vaporized refrigerant flows into the headers 38 and is then distributed from the headers 38 into the heat-radiating tubes 40. The vaporized refrigerant flowing through each heat-radiating tube 40 condenses in the heat-radiating tube 40 and sticks to the inner wall in the form of droplets. The liquefied refrigerant flows through the heat-radiating tubes 40 and drops down into the headers 38 under gravity. The heat conveyed by the vaporized refrigerant is discharged into the outside air from the heat-radiating tubes 40 via the heat-radiating fins 42 when it condenses in the heat-radiating tubes 40. Note that it is common to design the structure of the base 24 in such a way that the refrigerant circulates in a fixed direction.

With this type of cooling system for which vaporized refrigerant is made to circulate through the heat-radiator 26 whereupon it condenses, the heat-radiator 26 must be installed above the base 24, and so in the electronic device casing 10 of the present embodiment a configuration is adopted in which the heat-generator is installed on top of the base 24. This means that the base 24 can be positioned in a lower position in the electronic device casing 10, meaning that, compared with when the base 24 is installed on top of the heat-generator, a greater height can be secured for the heat-radiator 26, and so the volume necessary for the heat-radiator 26 to have the required cooling performance can be secured.

Figure 8:
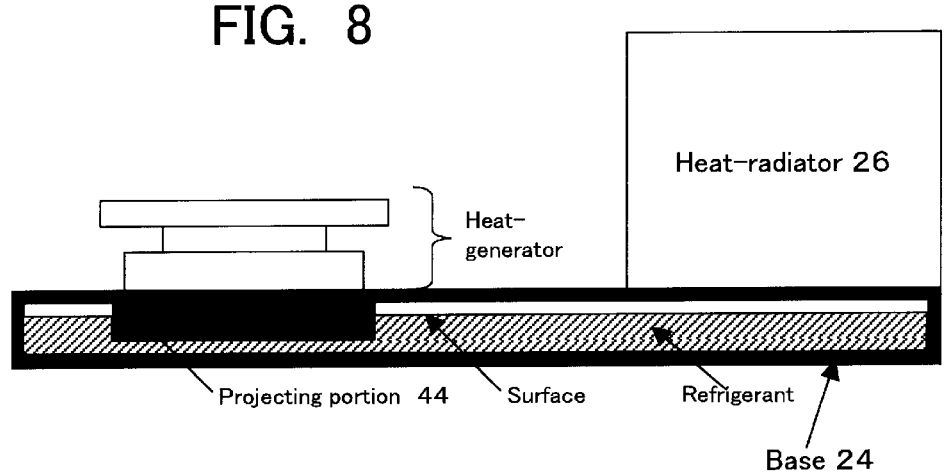
FIG. 8 shows the configuration of the cooling system in another embodiment of the present invention.

FIG. 8 shows the configuration of the cooling system in another embodiment of the present invention. In FIG. 8, the upper face part of the base 24 which is in direct contact with the heat-generator has a downward-pointing projecting portion 44 in order to ensure immersion in the refrigerant. When the heat-generator is installed on top of the base 24 as shown in FIG. 3, spaces may form in the hollow parts 34 of the base 24 due, for example, to the cooling system being tilted, in which case the upper face part of the base 24 that is in direct contact with the heat-generator may not come into contact with the refrigerant, meaning that heat taken in by the upper face part of the base 24 will not be directly transmitted into the refrigerant, resulting in relatively inefficient heat transfer. With the present embodiment, a downward-pointing projecting portion 44 that extends into the hollow parts 34 is thus provided on the inner surface of the upper face part of the base 24 that is in contact with the heat-generator in such a way that this projecting portion 44 is directly immersed in the refrigerant, this being so that heat taken in by the upper face part is directly transmitted into the refrigerant. In this way, heat generated by the heat-generator can be efficiently transferred into the refrigerant.

Figure 9:
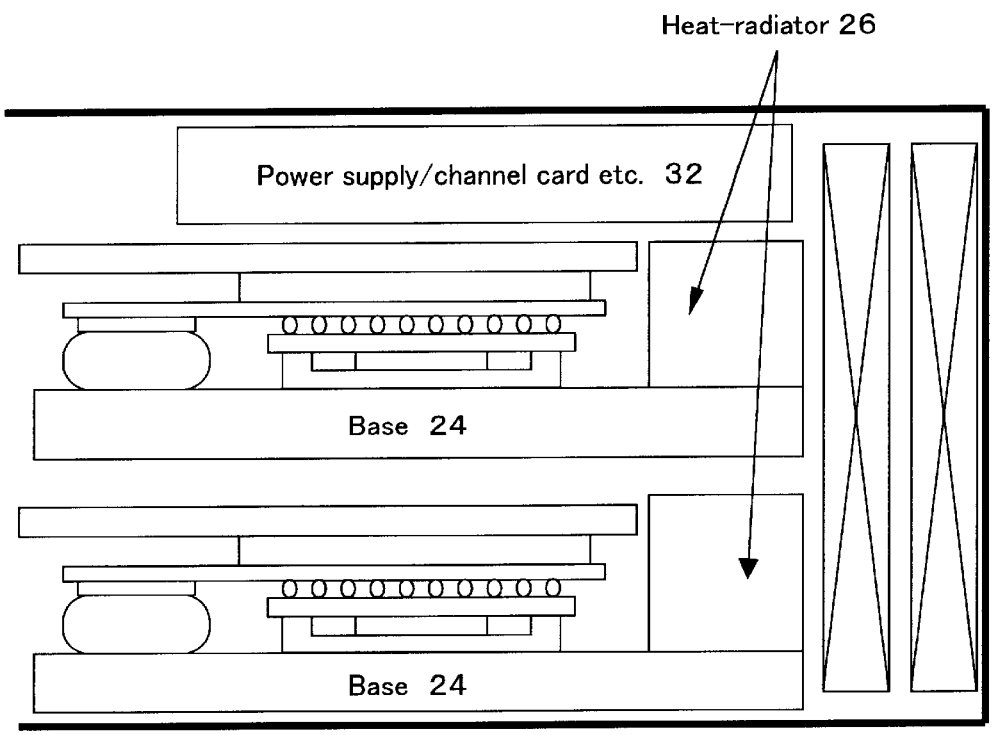
FIG. 9 shows an example of a configuration of the electronic device in another embodiment of the present invention.

FIG. 9 shows an example of a configuration of the electronic device in another embodiment of the present invention. In the electronic device shown in FIG. 9, there are two motherboards 12 each having a processor module 18 mounted thereon. In FIG. 9, the two motherboards 12 are placed in two tiers one above the other in the electronic device casing 10, and as with the previously mentioned embodiments each of the motherboards 12 is placed facing downwards, meaning that the processor modules 18 on the motherboards 12 are each positioned on top of the base 24 of a cooling system. When a plurality of heat-generators are positioned one above another in a plurality of tiers in the electronic device casing in this way, a cooling system is provided for each heat-generator, with each heat-generator being positioned on top of the base 24 of the respective cooling system. With this configuration, the height of each heat-radiator 26 can be increased compared with when each base 24 is positioned on top of the respective heat-generator, allowing cooling performance to be improved.

With the present invention, in an electronic device that contains a cooling system in which the refrigerant circulates through both the base and the heat-radiator and the heat-radiators installed away from the heat-generator, the heat-generator are positioned on top of the base. In this way, the height of the base in the electronic device becomes relatively low, meaning that the height of the heat-radiator—which must be installed above the height of the base—can be increased. Consequently, the heat-radiating region required for the heat-radiator in the height direction can be secured, meaning that high-performance cooling is possible. The present invention is particularly effective with thin electronic devices The scope of protection for the present invention is not limited to the above embodiments but rather extends to the invention disclosed in the patent claims and equivalents thereof.

What is claimed is:

1. An electronic device comprising:
    an electronic component, the electronic component being a heat-generator;
    an electrical board on which the electronic component is mounted;
    a cooling unit comprising
        a base having a first face that is thermally connected to the electronic component and having an internal hollow part filled with a refrigerant, and a heat-radiator that is thermally connected to the base and that has a space part that is linked to the hollow part, wherein the heat-radiator is positioned above the base on a side of the base near the electronic component, and the refrigerant, which vaporizes in the hollow part, circulates through the heat-radiator and condenses to form a liquid; and a casing having a bottom face and a top face and accommodating the electronic component, the electrical board, and the cooling unit, wherein the base is positioned in the bottom of the casing, the heat-generator is positioned on the base, and the electrical board is positioned on the heat-generator, in order, and wherein a height of the heat-radiator is greater than a distance from the bottom face of the casing to a top of the electronic component.

2. The electronic device according to claim 1, wherein the heat-radiator is thermally connected to part of the first face of the base.

3. The electronic device according to claim 2, wherein the base has a projecting portion on the hollow part side of the first face in the region in which the base is thermally connected to the heat-generator, with this projecting portion extending into the hollow parts and being immersed in the refrigerant.

4. The electronic device according to claim 1, wherein the electronic device is a portable computer.

* * * * *